US012712515B2

(12) United States Patent
Tucker et al.

(10) Patent No.: US 12,712,515 B2
(45) Date of Patent: Aug. 18, 2026

(54) ELECTROMAGNETIC INTERFERENCE FILTER

(71) Applicant: TE CONNECTIVITY SOLUTIONS GMBH, Schaffhausen (CH)

(72) Inventors: Andrew Cecil Tucker, Wonthaggi (AU); Tianyi Zhang, Olten (CH); Roland Gentsch, Hauterive (CH); Abiezer Tejeda, Solothurn (CH); Szymon Pasko, Orzesze (PL)

(73) Assignee: TE CONNECTIVITY SOLUTIONS GMBH, Schaffhausen (CH)

( * ) Notice: Subject to any disclaimer, the term of this patent is extended or adjusted under 35 U.S.C. 154(b) by 64 days.

(21) Appl. No.: 18/722,653

(22) PCT Filed: Dec. 7, 2022

(86) PCT No.: PCT/IB2022/061882
§ 371 (c)(1),
(2) Date: Jun. 21, 2024

(87) PCT Pub. No.: WO2023/119036
PCT Pub. Date: Jun. 29, 2023

(65) Prior Publication Data

US 2025/0055435 A1 Feb. 13, 2025

(30) Foreign Application Priority Data

Dec. 22, 2021 (EP) .................................... 21216782

(51) Int. Cl.
*H03H 7/01* (2006.01)
*H01F 27/24* (2006.01)
(Continued)

(52) U.S. Cl.
CPC ........... *H03H 7/0138* (2013.01); *H01F 27/24* (2013.01); *H01F 27/28* (2013.01); *H01F 41/0206* (2013.01)

(58) Field of Classification Search
CPC ........ H03H 7/427; H03H 7/09; H03H 7/0138; H03H 7/06; H03H 7/01; H03H 7/0153;
(Continued)

(56) References Cited

U.S. PATENT DOCUMENTS 9,130,542 B1 * 9/2015 Ishihara .............. H03H 11/126
10,476,464 B2 11/2019 Rambaud et al.
(Continued)

FOREIGN PATENT DOCUMENTS

EP 2007009 A2 12/2008
EP 3255770 A1 12/2017
(Continued)

OTHER PUBLICATIONS

Notice of Preliminary Rejection for Korean Application No. 10-2024-7023347, 3 pages, mailed Sep. 1, 2025.
(Continued)

*Primary Examiner* — John W Poos
(74) *Attorney, Agent, or Firm* — Jay J. Hoette; Carroll, Hoette & Butscher, LLC

(57) ABSTRACT

The invention relates to an electromagnetic interference (EMI) filter (100), having line-side terminals (L1-L3) for connecting to an electric supply(S) and load-side terminals (L1'-L3') for connecting to a load device (L), the EMI filter (100) comprises a load-side passive EMI filter stage (1) connected to the load-side terminals (L1'-L3') and is configured to suppress common-mode and differential-mode noise. The EMI filter (100) also comprises a line-side active EMI filter stage (3) connected to the line-side terminals (L1-L3) and is configured to suppress differential-mode
(Continued)

noise, and at least one intermediate active EMI filter stage (2) located between the load-side EMI filter stage (1) and the line-side EMI filter stage (3), configured to suppress common-mode noise. The invention relates also to a method for manufacturing the EMI filter (100).

13 Claims, 4 Drawing Sheets

(51) Int. Cl.
*H01F 27/28* (2006.01)
*H01F 41/02* (2006.01)

(58) Field of Classification Search
CPC .. H03H 7/1741; H03H 7/1708; H03H 7/1725; H03H 7/075; H03H 7/1758; H03H 7/1766; H03H 7/425; H03H 7/0123; H03H 7/32; H03H 7/40; H03H 7/17; H03H 7/00; H03H 7/0107; H03H 11/04; H03H 11/12; H03H 11/1217; H03H 11/126; H03H 11/10; H03H 11/28; H03H 11/42; H03H 11/1291; H03H 11/32; H03H 11/0422; H03H 11/1204; H03H 11/1234; H03H 11/245; H03H 11/44; H03H 11/06; H03H 11/1278; H03H 11/11; H03H 1/0007; H03H 7/0115; H02M 1/44; H02M 1/123; H02M 1/126; H02M 1/4225; H02M 1/12; H02M 1/0012; H02M 1/007; H02M 1/14; H02M 3/335; H02M 3/33569; H02M 3/158; H02M 7/003; H02M 3/157; H02M 3/33573; H02M 1/0064; H02M 1/32; H02M 1/0009; H02M 1/327; H02M 1/4208; H02M 3/1582; H02M 1/42; H02M 7/53873; H02M 1/0038; H02M 1/15; H02M 1/4216; H02M 3/003; H02M 1/4258; H02M 3/1584; H02M 1/0032; H02M 1/0058; H02M 1/08; H02M 1/143; H02M 1/322; H02M 3/1563; H02M 3/33523; H02M 7/5387; H02M 1/00; H02M 1/0003; H02M 1/0016; H02M 1/0048; H02M 1/0067; H02M 1/0083; H02M 1/0085; H02M 1/10; H02M 1/325; H02M 1/4266; H02M 3/01; H02M 3/1586; H02M 3/33507; H02M 3/33576; H02M 3/33584; H02M 7/043; H02M 7/219; H02M 7/4811; H02M 7/4815; H02M 7/53871; H02M 7/5395; H01F 27/24; H01F 17/062; H01F 27/2823; H01F 27/29; H01F 27/306; H01F 27/28; H01F 17/06; H01F 2017/0093; H01F 27/34; H01F 27/38; H01F 41/0206; H01F 27/006; H01F 3/10; H01F 37/00; H01F 2017/065; H01F 27/06; H01F 27/2895; H01F 27/33; H01F 2003/106; H01F 2027/065; H01F 27/2804; H01F 27/40; H01F 17/0013; H01F 27/266; H01F 27/324; H01F 2027/2809; H01F 2027/2819; H01F 27/2847; H01F 27/2885; H01F 27/346; H01F 27/36; H01F 27/363; H01F 1/26; H01F 17/02; H01F 17/04; H01F 17/043; H01F 2017/048; H01F 2027/297; H01F 27/263; H01F 27/2828; H01F 27/325; H01F 27/385; H01F 3/12; H01F 3/14; H01F 38/08; H01F 1/24; H01F 17/0006; H01F 2017/046; H01F 27/22; H01F 27/245; H01F 27/25; H01F 27/292; H01F 27/30; H01F 41/02; H01F 41/022; H01F 41/0226; H01F 7/04; H02H 9/005; H02H 1/0007; H02H 11/005; H02H 7/1213; H02H 3/18; H02H 7/125; H02H 9/04; H02H 9/041; H02H 9/044; H02H 11/002; H02H 5/005; H02H 9/00
See application file for complete search history.

(56) References Cited

U.S. PATENT DOCUMENTS

| | | | | |
|---|---|---|---|---|
| 2008/0024951 | A1 | 1/2008 | Mortensen et al. | |
| 2009/0128258 | A1* | 5/2009 | Xu | H03H 1/0007 333/167 |
| 2014/0312966 | A1* | 10/2014 | Hoene | H03H 11/04 327/558 |
| 2018/0294714 | A1* | 10/2018 | Chu | H02M 1/15 |
| 2024/0264220 | A1 | 8/2024 | Bambila et al. | |

FOREIGN PATENT DOCUMENTS

| | | | | |
|---|---|---|---|---|
| EP | 3553935 | A1 | 10/2019 | |
| EP | 3255770 | B1 | 1/2020 | |
| EP | 4044413 | A1 * | 8/2022 | H02M 1/44 |
| JP | 9-266677 | A | 10/1997 | |
| JP | 5167376 | B2 | 12/2012 | |
| WO | 2015177746 | A1 | 11/2015 | |
| WO | 2018/109801 | A | 6/2018 | |
| WO | 2021/166397 | A1 | 8/2021 | |

OTHER PUBLICATIONS

International Search Report and Written Opinion of the International Searching Authority mailed Mar. 22, 2023, in International Patent Application No. PCT/IB2022/061882 (10 pages).

* cited by examiner

ELECTROMAGNETIC INTERFERENCE FILTER

CROSS-REFERENCE TO RELATED APPLICATIONS

This application is a 371 of International Patent Application No. PCT/IB2022/061882, filed on Dec. 7, 2022, which claims the benefit of priority to European Patent Application No. 21216782.9, filed on Dec. 22, 2021, the contents of which are incorporated herein by reference in their entirety.

TECHNICAL DOMAIN

The present invention concerns an electromagnetic interference (EMI) filter for filtering common-mode and differential-mode noise. The present invention concerns also a method for manufacturing the EMI filter.

RELATED ART

Electric systems in industrial applications are becoming ever more complex and include a multitude of components that generate, or are liable to be disturbed by, electromagnetic interferences. Electric motors, for example, are often driven by electronic inverters that control the motor speed and torque by generating waveforms with variable frequency and amplitude. These systems provide high efficiency but generate powerful electromagnetic interferences.

Switching power converters are used in electric and hybrid vehicles as well as in countless other applications such as driving stationary motors, battery chargers, photovoltaic systems, lighting control, computers, and other. In all these cases, the switching action of the converter is a source of electromagnetic interference that could, if it is not managed or attenuated, affect the functioning of other electrical systems, or exceed normative limits. Electromagnetic interferences are often indicated by the acronym EMI in the art and in the present disclosure. It is also frequent to use the expression "noise" to denote the electromagnetic interferences although these are not of stochastic nature. The present disclosure will use the expression "noise" in this way, too.

Electric or electronic filters used to attenuate these unwanted electromagnetic interferences, called electromagnetic interference filters or EMI filters in short, are used in all branches of electric engineering to improve reliability and respect existing norms. Well-designed filtering system are essential to the performance of many complex electric systems.

It is known to use passive low-pass LC filters to attenuate EMI and such filters have been proven effective in a high number of applications. While passive solutions do offer substantial attenuation, they have their limits. One limit of passive EMI filters is the desired attenuation levels require high-value capacitors and inductances. The size and cost of the resulting filter are mainly determined by these large components. High-value capacitors also lead, in many applications, to high current levels in the earthing system (leakage currents) and reactive currents, both undesirable and detrimental to the system operation.

A substantial reduction in size of high-value capacitors and inductances can be achieved by pairing EMI filters with active filter stages, so-called active EMI filters. The combination of these two different filter technologies can lead to significant reductions of size and cost.

Most, if not all, EMI filters combining passive and active filter stages that are known from literature are either optimised for the attenuation of common-mode noise or differential-mode noise.

Patent document U.S. Pat. No. 10,476,464 discloses an EMI common-mode filter device with two serially connected LC-filters, two transformers and an active current control circuit. The transformers are dedicated to sensing a common-mode current and injecting compensation currents driven by the current control circuit. The common-mode filter is specifically designed to reduce common-mode noise.

The structure of the common-mode filter is complex. The active current control circuit is designed to provide the attenuation only under specific operational conditions, where the LC-filters are configured to produce partial common-mode filter function even in case of failure of the current control circuit.

International patent application WO 2015/177746 discloses an EMI active differential-mode line filter with at least one passive filter stage which enables the filter to filter high frequency common-mode noise and at least one current detection circuit which enables noise to be detected and at least one wave generator circuit which enables the voltage obtained through the current detection circuit to come to the same waveform with the noise.

This document discloses further at least one supply circuit which generates the power required for an active filter and at least one current amplifier circuit which transfers a signal generated by an active filter and having the same waveform with the noise to the line in the input of the current detection circuit. This filter, in particular the passive filter stage, is bulky and may provide insufficient attenuation for common-mode noise signals.

SHORT DISCLOSURE OF THE INVENTION

One object of the invention is the provision of an EMI filter that is designed for filtering common-mode and differential-mode noise with a high attenuation for both noise modes, preferably at both the line side and the load side.

Another object of the invention is the provision of an EMI filter that is arranged for filtering common-mode and differential-mode noise and is at the same time reduced in size, as lower values for the inductance and/or capacitance for passive components is. This results in a significant reduction of materials, such as iron, copper, etc., being used so that the design also is more stainable. The EMI filter furthermore is easy to manufacture compared to related conventional EMI filters known from the literature. A further object of the invention is the provision of an EMI filter that is configured for filtering common-mode and differential-mode noise and provides sufficient noise attenuation also at frequencies below 150 kHz.

According to the invention, these aims are attained by the object of the attached claims and especially by an EMI filter, having line-side terminals for connecting to an electric supply and load-side terminals for connecting to a load device, a load-side passive EMI filter stage connected to the load-side terminals and configured to suppress common-mode and differential-mode noise, a line-side active EMI filter stage connected to the line-side terminals and configured to suppress differential-mode noise.

Dependent claims introduce important and useful, but not essential, features, such as an intermediate filter stage between the load-side EMI filter and the line-side one, configured to suppress common-mode noise, first and second inductive elements as well as a capacitive element in the load-side passive filter, a common-mode circuit sensor in the intermediate stage, for example a current transformer, driving a current amplifier that injects a compensation current in the supply line that cancels a common-mode noise current, and an actuation transformer in the line-side unit that is driven by a voltage amplifier to generate an electromotive force in the supply lines that cancels a measured EMI voltage on the lines. The actuation transformer can be driven to provide differential-mode noise cancellation and, if desired, common-mode noise cancellation.

The actuation transformer mentioned above will have a structure coherent with the number of phases present in the power line. In the important cases of three-phase and single-phase power lines the actuation transformer will have three phases, respectively a single phase. Preferably, the actuation transformer will have a single magnetic core. To simplify the assembly, it has been found advantageous to fashion the core of the actuation transformer with two juxtaposed magnetic elements that can be separated to concatenate the actuation transformer with the power line without cutting or moving the power conductors (which can be rigid busbars). An air gap between the core elements was found to be beneficial to avoid material saturation.

The intermediate-side active filter and the line-side active filter are preferably feedback filters, in that an error signal (a common-mode current, respectively a differential-mode voltage, for example) is sensed on the line, amplified by suitable amplifiers and injected as cancellation signal on the line before the measure point. The gain of the amplifiers is preferably variable and controlled automatically by a slow servo circuit, to maintain the output in a desired range without overdriving the circuit.

In relation with the interference source connected to the load terminals of the filter, the stages of the filter are preferably dimensioned such that the resonance frequency of the load-side passive EMI stage is smaller or greater than a fundamental frequency of the interference, for example two or five times higher. In addition, or alternatively, the stages of the filter are preferably such that the EMI filter has no self-resonance. In addition or alternatively the stages of the filter are designed such that the resonance frequency of the load-side passive EMI stage has no impact on switching frequency of load. The resonance frequency is determined by several factors, among them, important factors are the selection of the inductance and capacitance values and/or nonlinear elements of the load-side passive EMI stage On the other hand, the resonance frequency of the load-side passive EMI stage is smaller or greater than the resonance 20 frequency of a passive EMI filter featuring an attenuation comparable to the attenuation of the hybrid filter, since the inductance and capacitance values are comparably smaller. In the important use case where the interference source is a switching power converter, the fundamental frequency may be taken as a carrier frequency of the converter.

The EMI filter, particularly the load-side passive EMI filter stage, can be configured to damp or suppress resonances.

Further advantages of the invention can be deducted from the disclosure that follows.

SHORT DESCRIPTION OF THE DRAWINGS

Exemplar embodiments of the invention are disclosed in the description and illustrated by the drawings in which:

FIG. 1 illustrates schematically an EMI filter according to a preferred embodiment.

FIG. 2*a*, 2*b* illustrate a possible configuration of the capacitive filtering element, with a means for damping or suppressing oscillations according to an embodiment.

EXAMPLES OF EMBODIMENTS OF THE PRESENT INVENTION

Figure 1:
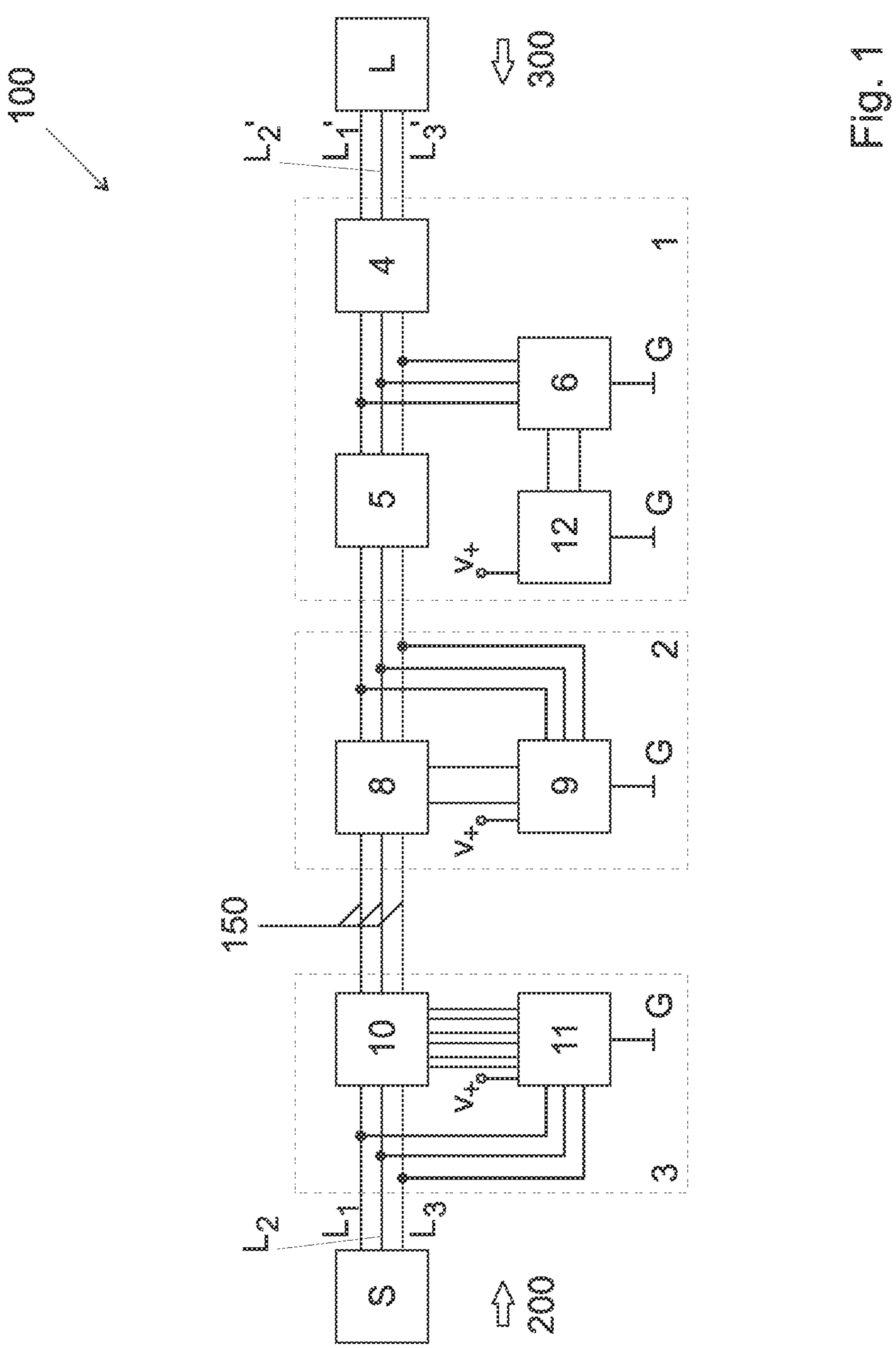

Referring to FIG. 1, an EMI filter 100 according to the invention is inserted on a supply line 150 (in this case a three-phase line) between a load 300 and a supply source 200. The filter is inserted on the line by means of suitable conductive terminals or conductors L1, L2, L3 on the line side and L1', L2', L3' on the load side. The load 300, which may be a motor drive with cable and electric motor, generates common-mode and differential-mode noise.

The electric supply S can be any kind of electrical source arranged to provide electric power at the line-side terminals L1, L2, L3. "Line-side" or "load-side" relates in the context of this disclosure to a physical location and/or electrical connection node of a device with respect to a location on the electric supply line 150. Line-side means a location or electrical connection node on the electric supply line 150 being closer to the electric supply S than to the load L, whereas load-side means a location or electrical connection node being closer to the load L than to the electric supply S.

The electric supply S may provide DC power or AC power, single-phase or multiphase. The load device L on the other hand can be any kind of device that draws electrical energy and is arranged to conduct noise to the electric supply line 150 when being connected to the load-side terminals L1', L2', L3'. Devices that are known to generate conducted EMI are for example electric generators, power supplies, voltage regulators, oscillators and battery chargers.

EMI are conducted along the supply line and are progressively mitigated or attenuated by the different filter stages 1, 2, 3 travelling towards the electric energy source side 200.

Moving from the load side to the line side, the filter 100 has first a load-side passive stage 1. The passive filter 1 is subject to the highest level of noise having the largest bandwidth. passive filter 1 attenuates the amplitude of the noise that will reach the following stages and reduces its bandwidth. Preferably, the load-side passive EMI filter stage 1 is configured to suppress common-mode and differential-mode noise at the same time.

"Passive" in the context of the disclosure leads to a configuration of capacitors, inductors and selectively resistors that forms the passive EMI filter stage 1. Passive filters do not depend upon external power sources and they do not contain active components, such as amplifier circuits.

Active filter stages 2, 3 following the load-side passive EMI filter stage 1 do not need to cope with the full dynamics and bandwidth of the noise, since the passive filter stage 1 provides a significant attenuation, especially in the higher part of the frequency range. They can be designed for this reduced amplitude and bandwidth and, as a result, they may be smaller and have a lower costs.

On the other hand, the attenuation introduced by the active stages 2, 3 adds to that of the passive filter 1. Advantageously, the passive filter is not required to introduce a very high attenuation, but it is enough that the noise, by traversing the passive filter 1 is reduced to a level that the active stages 2 and 3 can accept. This is mutually beneficial, because the passive filter stage 1 can be designed for a smaller attenuation, particularly at low frequency, and therefore without bulky inductors and capacitors.

Returning to the passive filter stage 1, it comprises, in this embodiment, a first inductive filtering element 4 and a second inductive filtering element 5 inductively coupled to the electric supply line 150.

The first inductive filtering element 4 can be a common-mode inductor that is electrically connected to the electric supply line 150. More preferably the first filtering element 4 is provided by a single ferrite core element that is placed on the electric supply line 150, such that the ferrite core element provides a common-mode attenuation to the noise on the electric supply line 150, by providing a common-mode impedance.

The second inductive filtering element 5 could have the same structure as the first inductive filtering element 4, possibly with higher or different inductance values. Typical values for the inductance of these components are between 10 μH and 50 μH, but these figures may vary according to the application.

The passive stage 1 further comprises a capacitive filtering element 6, electrically connected to the electric supply line 150 between the first inductive filtering element 4 and the second inductive filtering element 5. The capacitive filtering element 6 can have connectors to arrange an electrical connection with the electric supply line 150 and the ground G.

The capacitive filtering element 6 is configured to suppress common-mode and differential-mode noise on the electric supply line 150. The capacitive filtering element 6 can be arranged with multiple capacitors that are interconnected to provide a network of X-connected capacitors, to attenuate differential EMI, and Y capacitors bypassing common-mode EMI towards a common potential node G, as it is known in the art.

Y capacitors are well known and typically connected to ground G. A network of X capacitors sometimes is referred to as delta capacitor network, whereas a network of Y capacitors is known as star capacitor network. Delta capacitor networks can be used to bypass differential-mode noise, whereas star capacitor networks can be used to bypass common-mode noise. Suitable configurations of capacitor networks are known from literature.

FIG. 1 also illustrates a low voltage power supply 12 connected to the capacitive filtering element 6. This element is used to provide a low-level power supply V+ needed by the active filter stages 2 and 3, particularly to the current amplifier circuit 9 and the voltage amplifier circuit 11. The power supply 12 may be conveniently connected to the capacitor bank 6, but this is not a requirement, and in fact it could be embodied by any suitable DC source of low voltage, for example ±10 V. The power supply 12 is not a functional part of the passive filter stage 1 and does not contribute to noise attenuation directly.

Passive stage 1 is drawn as a low-pass “T” LC filter but could have other configurations and present low-pass, band-pass, or band-stop transfer function. As most passive LC filters, resonates at a specific frequency or at more than one resonance frequencies. The resonances may be damped by suitable dissipative elements, such as resistors or varistors.

A line-side active EMI filter stage 3 is connected to the line-side terminals L1, L2, L3. The line-side active EMI filter stage 3 is arranged to suppress differential-mode noise on the electric supply line 150. In the represented embodiment, the EMI filter 100 features an intermediate active EMI filter stage 2 on the electric supply line 150 between the passive stage 1 and the active line-side stage 3 that is configured to suppress common-mode noise on the electric supply line 150.

Locating the intermediate active EMI filter stage 2 between the load-side EMI filter stage 1 and the line-side EMI filter stage 3 has the advantage that the line-side EMI filter stage 3 presents a high impedance to the electric supply S. In this manner, the EMI filter does not disturb other devices sharing the electric supply.

In one aspect of the invention, the resonance frequency or the resonance frequencies mentioned above are dimensioned having regard to a fundamental frequency of the interferences generated by the load device L connectable or connected to the load-side terminals L1', L2', L3'. The expression “fundamental frequency” should be read in the context of this disclosure as the component of the noise with the lowest frequency and/or the highest amplitude, also when the noise is not strictly periodical, as it often happens. In the important use case where the load is a switching converter, the fundamental frequency may be the switching frequency, also named carrier frequency, of the converter.

The fundamental frequency might be a frequency in the range of 1 kHz to 200 kHz. In most applications, the frequency of the carrier might be in the range of 2 kHz to 20 kHz, or in the range of 50 kHz to 200 kHz.

The load-side passive EMI filter stage 1 is configured such that it exhibits a resonance frequency that is smaller or greater than the fundamental frequency of the noise coming from the load L. Preferably, the resonance frequency is at two times, or better five times, different from the fundamental frequency of the noise. Thanks to this, ringing and oscillations in EMI filter 100 are minimised, and resistors that are usually installed to dampen these oscillations can be omitted or dimensioned conservatively, with a significant gain in efficiency. A high resonance frequency can be achieved by choosing small values of L and C in the passive elements 4, 5, 6, and often comes with a reduced attenuation at low frequency. This is not a shortcoming since the attenuation at low frequency is boosted by active stages 2 and 3. The active stages 2 and 3, on the other hand, preferably are also dimensioned with a high resonance frequency.

The EMI Filter 1 can be configurated in a further embodiment with a resonance frequency as explained before, but resonances stimulated by the emissions of the load L can be alternatively or in addition damped or suppressed using a related means preferably comprised in the load-side passive EMI stage 1. In total, can the EMI Filter 1 be configurated without showing resonance phenomena, as any stimulation would lead to sufficient damping or suppression of resonances. The means in combination with the specific design for the resonance frequency leads in combination to a robust and stable operation of the EMI Filter 1 even in an environment with high noise levels.

Adding a means for damping improves the flexibility for designing the load-side passive EMI stage 1 drastically. The load-side passive EMI stage 1 can be designed to provide a “One size fits all solution” for all intended applications. Even when the load-side passive EMI stage 1 would be combined with a noise emitting load L emitting noise with a fundamental frequency close to the resonance frequency of the load-side passive EMI stage 1, would the damping means prohibit any resonance phenomena in the EMI Filter 1. Consequently, can the load-side passive EMI stage 1 be designed with a specific resonance frequency but for multiple applications.

The presented example supposed an energy flow from the source S towards the load L, but this is not a requirement of the invention, which could apply also to generation systems or motors with regenerative braking, in which the electrical power delivered to the load L may be negative, momentarily or permanently. In other words, the switching power converter might be configured as unidirectional or bidirectional switching power converter.

The intermediate active EMI filter stage 2 preferably includes a common-mode current sensor 8, for example a current transformer or a shunt resistor, that is arranged to provide a common-mode noise signal proportional to a common-mode noise current circulating in the electric supply line 150.

The current amplifier 9 is arranged to receive the common-mode noise signal and generate a noise cancellation current having the opposite sign as the noise current. The noise cancellation current is injected into the electric supply line 150 to attenuate the common-mode noise current circulating therein. The represented variant is in the feedback configuration: the cancellation current is injected before the sensor 8 (on the load side with respect to the sensor). Feed-forward filters are also possible and included in the scope of the invention.

In this embodiment the line-side active EMI filter stage 3 includes a voltage amplifier circuit 11 whose input is connected to the electric supply line 150 and is sensitive to a voltage noise on the voltage line. Even if it is not represented in FIG. 1, it is understood that the voltage present on the line will be brought to a level acceptable to the amplifier's input by a suitable divider or by a protection circuit.

In contrast to the intermediate stage that was configured to suppress a common-mode noise, the line-side stage 3 is configured to suppress a differential-mode noise and works on multiphase signals if the supply line 150 is a multiphase one. Since the common-mode noise is taken care of by the intermediate stage, the line-side stage can deal with the differential-mode noise only. This is not an essential feature of the invention, however, and the filter stage 1 could be configured to attenuate a common-mode noise component as well.

The output of voltage amplifier 11 generates a cancellation voltage that is superimposed to the voltages of the supply line, thereby attenuating the noise. The filter is also represented in the feedback configuration but, as for the intermediate stage, this is not essential.

As represented, the output of the amplifier is preferably connected to the supply line 10 through an actuation transformer 10. The amplifier 11 injects current in a set of primary windings of the actuation transformer 10 and, by magnetic induction, the transformer 10 induces an electromotive force in the conductors of the supply line 150, which are arranged as secondary windings.

The voltage or voltage signal is induced having an opposite phase, with respect to noise components flowing in the electric supply line 150 to attenuate the voltage noise present thereupon.

Figures 2A, 2B:
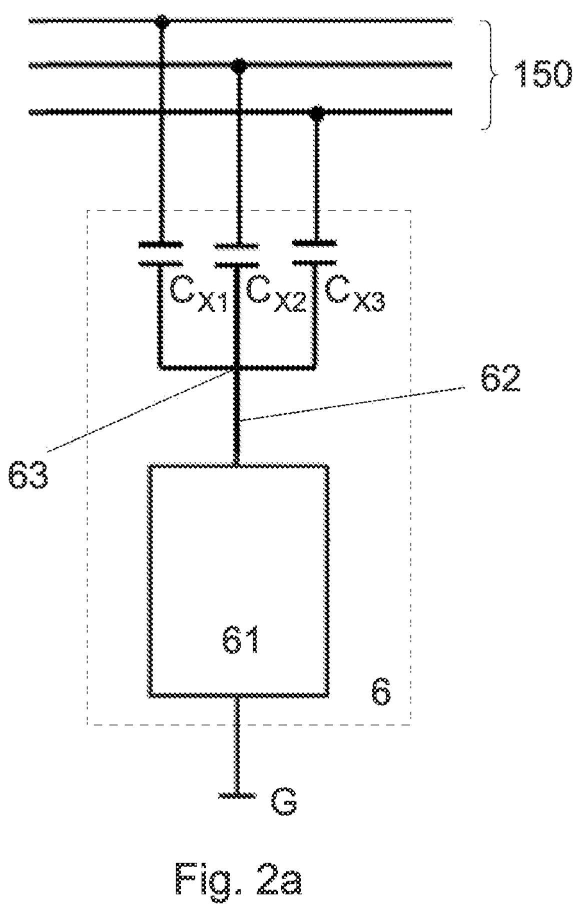

FIG. 2*a* illustrates a possible configuration of the capacitive filtering element 6 relating to a further embodiment with a means for damping or suppressing oscillations namely, a capacitive discharge damping means 61 for damping or suppressing resonances. Three X capacitors $C_{X1} \ldots C_{X3}$ are connected on one end to each phase of the electric supply line 150. The second end of the three X capacitors $C_{X1} \ldots C_{X3}$ are interconnected to form a start point 63. The capacitive discharge damping means 61 is connected via a node 62 between the star point 63 and the ground G.

FIG. 2*b* illustrates a possible configuration of the capacitive discharge damping means 61, which comprises a first branch 64 and a second branch 66 each connected between the node 62 and the ground G.

The first branch 64 comprises a first one-way conductor $D_1$ and a first Y capacitor $C_{Y1}$ connected in series. A first circuit point 65 is arranged between the first one-way conductor $D_1$ and a first Y capacitor $C_{Y1}$. The first one-way conductor $D_1$ is arranged between the node 62 and the first capacitor $C_{Y1}$. The forward direction of the first one way conductor $D_1$ is from the node 62 to the first capacitor $C_{Y1}$ or toward the ground.

The second branch 66 comprises a second one-way conductor $D_2$ and a second capacitor $C_{Y2}$ connected in series. A second circuit point 67 is arranged between the second one-way conductor $D_2$ and the second capacitor $C_{Y2}$. The second one-way conductor $D_2$ is arranged between the node 62 and the second capacitor $C_2$. The forward direction of the second one-way conductor $D_2$ is to the node 62 from the second capacitor $C_{Y2}$ or away from the ground.

The first capacitor $C_{Y1}$ and the second capacitor $C_{Y2}$ act as Y capacitors.

A one-way conductor is defined as any component or group of components which has an asymmetric conductance, i.e. conducts the current in a forward direction better than in a reverse direction. Preferably, the one-way conductor allows to pass substantially the full current in the forward direction and blocks substantially all the current in a reverse direction. Preferably, the one-way conductor $D_1$ and $D_2$ is a Diode.

A resistor R is connected between the first branch 64 and the second branch 66. Preferably, the resistor R is connected between the first circuit point 65 and the second circuit point 67.

The two one-way conductors $D_1$ and $D_2$ in the two branches 64 and 66 are configured such that the first capacitor $C_{Y1}$ receives only the charges of a first polarity (here positive) and the second capacitor $C_{Y2}$ only the charges of a second polarity (here negative). Due to the one-way conductor $D_1$ and $D_2$, the charges from the capacitors $C_{Y1}$ and $C_{Y2}$ cannot flow back to the node 62. The capacitors $C_{Y1}$ and $C_{Y2}$ discharge over the resistor R and reduce such the voltage time integral and the common-mode current, which finally reduces or prevents oscillations in the EMI Filter 100, in particular in the load-side passive EMI filter stage 1 which can be stimulated by the emissions of the load device L with its fundamental frequency. The capacitive discharge damping means 61 shows a non-linear behaviour. In addition, due to its configuration, the capacitive discharge damping means 61, energy-efficient, compared to other solutions known in the prior art.

Figure 3:
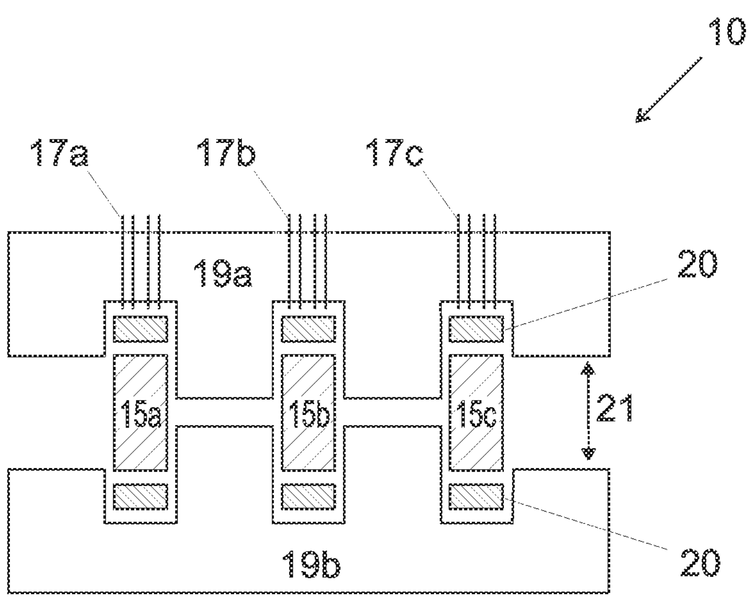
FIG. 3 and FIG. 4 illustrate an actuation transformer according to an embodiment.

FIG. 3 illustrates possible realisation of an actuation transformer 10 suitable for the invention Preferably, the actuation transformer has a magnetic core split into two core elements 19*a* and 19*b*. The magnetic core elements 19*a*, 19*b* are preferably made of soft magnetic material, such as manganese-zinc ferrites, nickel-zinc ferrites or equivalents, with low coercivity and low hysteresis losses at the frequencies where the noise is expected.

Each of the magnetic core elements 19*a*, 19*b* is provided with multiple recesses being able to accommodate electrical conductors 15*a*, 15*b*, 15*c* and insulation material 20. In this example each of the magnetic core elements 19*a*, 19*b* is provided with three recesses, corresponding to the three phases of the supply line 150.

The first magnetic core element 19*a* is provided with a first, second and third 17*a*, 17*b*, 17*c* coil element. Each of the coil elements 17*a*, 17*b*, 17*c* preferably is made with a wire that is wound multiple times around the first magnetic core element 19*a* and is arranged in one of the recesses of the first magnetic core element 19*a*.

The wire might be coated with a varnish, to electrically insulate the windings from each other. The coil elements 17*a*, 17*b*, 17*c* can be electrical insulated from the first magnetic core element 19*a* using insulating material (not shown). The insulating material might be placed between the coil elements 17*a*, 17*b*, 17*c* and a surface of the magnetic core element 19*a*.

A first conductor 15*a*, a second conductor 15*b* and a third conductor 15*c* is arranged in each of the recesses. The conductors 15*a*, 15*b*, 15*c* can be a part of the electric supply line 150 and may be configured to carry the main current and the common-mode and/or current-mode noise, that flows between the electric supply S and the load device L, or vice versa. Each of the conductors 15*a*, 15*b*, 15*c* might be provided with an electrical insulation.

In addition, or alternatively, the conductors 15*a*, 15*b*, 15*c* are electrically insulated from the magnetic core elements 19*a*, 19*b* using insulating material 20, as shown in FIG. 3.

The magnetic core elements 19*a*, 19*b* are arranged such that they enclose the conductors 15*a*, 15*b*, 15*c* of the electric supply line 150. The magnetic core elements 19*a*, 19*b* furthermore are arranged, such that they provide a closed magnetic circuit, meaning that the conductors 15*a*, 15*b*, 15*c* of the electric supply line 150 form a secondary winding.

The coil elements 17*a*, 17*b*, 17*c* form a primary winding and the magnetic core elements 19*a*, 19*b* form a magnetic core 19, being part of a transformer, more specifically being part of the actuation transformer 10. The magnetic core 19 can be provided with an airgap 21 to linearise the inductance of the actuation transformer 10 and to avoid saturation, as the airgap 21 reduces the slope of the related B/H loop.

Primary and secondary in the context of this disclosure relates to the side of the actuation transformer 10 where a varying magnetic flux in the magnetic core 19 is generated.

Figure 4:
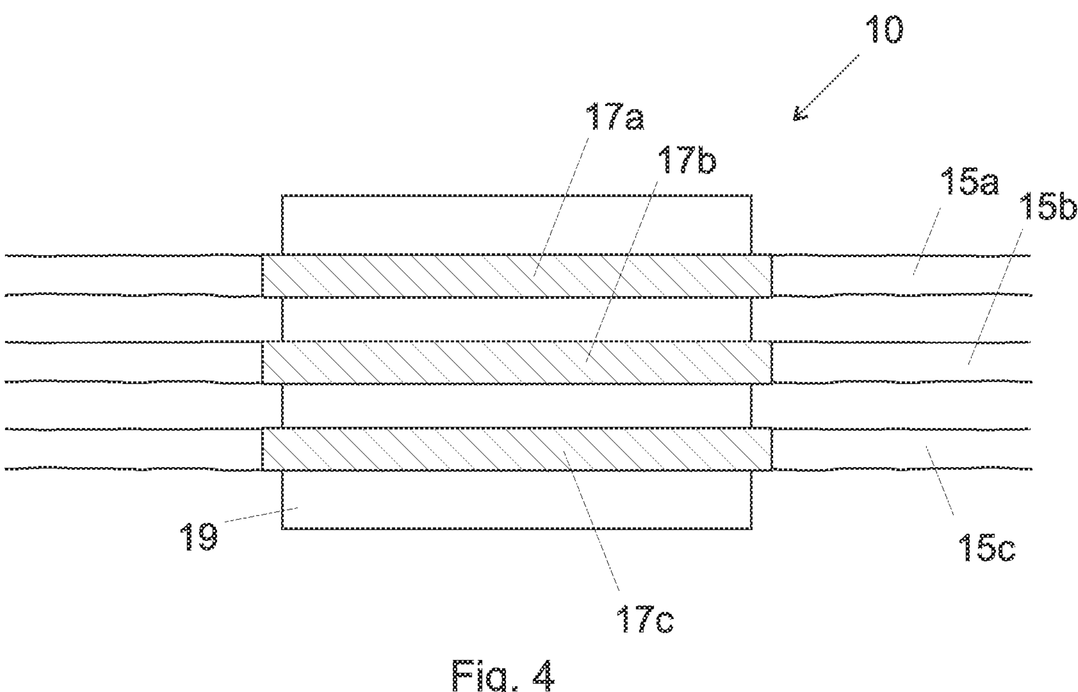

FIG. 4 illustrates an actuation transformer 10, according to one embodiment of the EMI filter 100, with a magnetic core 19, three conductors 15*a*, 15*b*, 15*c* that are enclosed by the magnetic core 19 and three coil elements 17*a*, 17*b*, 17*c* that can be connected to the voltage amplifier circuit 11. The three conductors 15*a*, 15*b*, 15*c* are part of the electric supply line 150.

FIG. 4 illustrates an actuation transformer 10, an electric supply line 150 and an EMI filter for a three-phase AC system. The electric supply line 150 alternatively can be a single-phase or a multiphase AC line, connecting the supply S to the load device L. The actuation transformer 10 alternatively might be a single-phase or a multiphase transformer with a single magnetic core 19 formed by the first and second magnetic core elements 19*a*, 19*b*.

Arranging the magnetic core 19 of the actuation transformer 10 with two magnetic core elements 19*a*, 19*b* provides the advantage that the actuation transformer 10 can be easily installed on existing supply lines 150 having multiple conductors 15*a*, 15*b*, 15*c*. It is not necessary to disconnect or disassemble the electric supply line 150 as the actuation transformer 10 can be assembled around or clamped on an existing supply line 150. Thus, top hat rail mounting might be a typical application for the actuation transformer 10.

Figure 5:
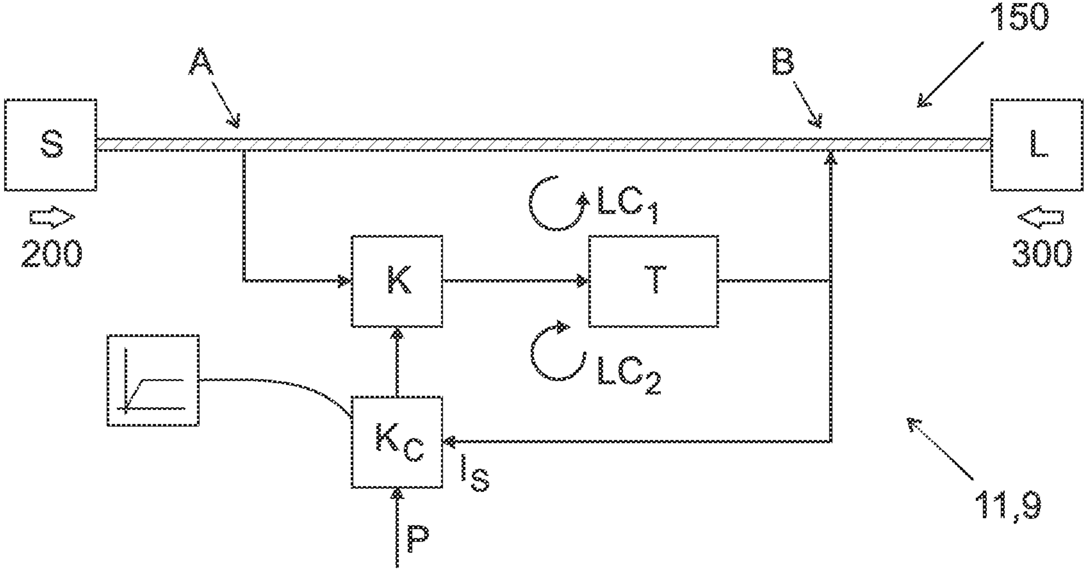
FIG. 5 illustrates a control diagram of the current and/or voltage amplifier circuit according to a further embodiment.

FIG. 5 is a conceptual representation of an active filtering stage as those used in the invention, either in the intermediate stage 2 or in the line-side stage 3. The load L and the source S are connected by a supply line 150 that is represented as unifilar, being it understood that it may be a multiphase power line.

The amplifier circuits 9, 11 receive a noise signal (that may be a voltage, current signal, common-mode or differential one) that is proportional to the noise sensed at point A on the electric supply line 150. The sensing point A is located at the electric energy source side 200. The active filtering stage is configured to inject a cancellation signal at the summing point B. The summing point B is located at the load device side 300.

The intermediate active EMI filter stage 2 or the line-side active EMI filter stage 3 includes an amplifier circuit 9, 11 that produces an output that represented, conceptually, by a cascade of an ideal gain stage K, which can be variable and a transfer function T. The amplifier 11, 9 connected between A and B constitutes a first feedback control loop $LC_1$ that introduces an attenuation of the noise in known fashion.

A second control loop $LC_2$ is a used to control the gain K adaptively. The control loop $LC_2$ is sensitive to the noise level and, when the noise exceeds a given range, such that the amplifier circuit 9, 11 may be driven into saturation, intervenes to reduce the gain K. In normal conditions, when the noise level is below a predetermined threshold, the second control loop $LC_2$ is inactive, and the gain K has its nominal value.

When the noise exceeds a given threshold, the gain K is progressively reduced, following a predetermined gain control function Kc. The gain control function, in the embodiments may be a linear function clipped to a maximum value. The maximum value may be related to a maximum output of the amplifier circuit 9, 11, or it could be set by an input variable P.

The gain K may need to be reduced when the load device L needs to draw more power than specified for example in an overload operation mode. In this case, the filter on the invention operates consistently, avoiding saturations and oscillations and provides a measure of attenuation in all cases.

The first control loop $LC_1$ and the second control loop $LC_2$ operate on different time scales. The transfer function T of the first control loop $LC_1$ determines the attenuation bandwidth of the stage and should be as extended as the noise requires. The second control loop $LC_2$ operates at slower speed and may have a time constant of several milliseconds.

This is advantageous as the first control loop $LC_1$ is configured to react very quickly with respect to a noise signal at the sensing point A, whereas the second control loop $LC_2$ with its negative feedback loop finds a suitable operating point for the loop gain.

This arrangement with a fast control loop $LC_1$ to attenuate the noise, and a slower servo loop to change the feedback gain k based on the noise level is advantageous in that it improves the stability of the active EMI filter stages 2, 3, in particular when the intermediate active EMI filter stage 2 and the line-side active EMI filter stage 3 are each arranged with an amplifier circuit 9, 11 as explained before.

The invention as set out before also relates to a method for manufacturing the EMI filter 100, in particular for manufacturing the actuation transformer 10.

The method for manufacturing comprises the following steps:

providing a plurality of conductors 15*a*, 15*b*, 15*c*, providing the first magnetic core element 19*a* and the second magnetic core element 19*b*, placing the conductors 15*a*, 15*b*, 15*c* between the first magnetic core element 19*a* and the second magnetic core element 19*b*, uniting the first magnetic core element 19*a* and the second magnetic core element 19*b*.

Uniting means to bring the first magnetic core element 19*a* and the second magnetic core element 19*b* as close as necessary together. This does not exclude that there is a remaining airgap 21 between first magnetic core element 19*a* and the second magnetic core element 19*b*. The magnetic core elements 19*a*, 19*b* are arranged or placed such that they provide a closed magnetic circuit.

The method further includes the step of:

securing the core elements 19*a*, 19*b*.

The core elements 19*a*, 19*b* might be secured using fixing material, such as glue or varnish. Other means such as clamping fixtures can be used in addition or alternatively to secure the core elements 19*a*, 19*b* and to hold them in place. The core elements 19*a*, 19*b* might be arranged in a housing, after securing their position relative to each other.

The method also comprises the step of:

connecting the conductors 15*a*, 15*b*, 15*c* to the load-side terminals L1', L2', L3' on a first side of the actuation transformer 10 and to the line-side terminals L1, L2, L3 on a second side of the actuation transformer 10 opposed the first side.

The steps preferably are processed in the order as set out before, but alternatively can be performed in any different order. It might be possible to connect in a first instance the conductors 15*a*, 15*b*, 15*c* to the load-side terminals L1', L2', L3' and to the line-side terminals L1, L2, L3 and then providing the remaining components and the closing the magnetic circuit in a subsequent step.

This is possible with reference to an embodiment disclosed before because the actuation transformer 10 is provided by two single core elements 19*a*, 19*b*, whereas only one of the two core elements 19*a*, 19*b* is provided with coil elements 17*a*, 17*b*, 17*c*.

This allows to equip an electric supply line 150 supplementarily with the EMI filter 100 and makes the related manufacturing process easy.

Even though the embodiments or aspects as disclosed herein before might discuss different aspects of the invention, they may be combined individually or as a combination of in one single EMI filter 100 when technically possible and useful. However, they might also be considered individually when necessary.

REFERENCE SIGNS

1 load-side passive EMI filter stage
2 intermediate active EMI filter stage
3 line-side active EMI filter stage
4 first inductive filtering element
5 second inductive filtering element
6 capacitive filtering element
8 common-mode current sensor
9 current amplifier circuit
10 actuation transformer
11 voltage amplifier circuit
12 low voltage power supply
15*a* first conductor
15*b* second conductor
15*c* third conductor
17*a* first coil element
17*b* second coil element
17*c* third coil element
19 magnetic core
19*a* first magnetic core element
19*b* second magnetic core element
20 insulating material
21 air gap
61 capacitive discharge damping means
62 node
63 start point
64 first branch
65 first circuit point
66 second branch
67 second circuit point
100 EMI filter
150 electric supply line
200 electric energy source side
300 load device side
A sensing point
B summing point
$C_{X1} \ldots C_{X3}$ X capacitor
$C_{Y1}$, $C_{Y2}$ Y capacitor
G ground
$I_S$ input signal
K gain function
$K_C$ gain control function
L load or load device
L1 first line-side terminal
L2 second line-side terminal
L3 third line-side terminal
L1' first load-side terminal
L2' second load-side terminal
L3' third load-side terminal
$LC_1$ first control loop
$LC_2$ second control loop
P peak threshold value setpoint
S electric supply
T transfer function
V+ low voltage

The invention claimed is:

1. Electromagnetic interference filter, having line-side terminals for a connection to an electric supply and load-side terminals for a connection to a load device, the electromagnetic interference filter comprising:

a load-side passive electromagnetic interference filter stage connected to the load-side terminals and configured to suppress common-mode noise, a line-side electromagnetic interference filter stage connected to the line-side terminals, and configured to suppress differential-mode noise, wherein the load side passive electromagnetic interference filter stage is configured to suppress differential mode noise and the line-side electromagnetic interference filter stage is a line-side active electromagnetic interference filter stage, further comprising an intermediate active electromagnetic interference filter stage between the load-side electromagnetic interference filter stage and the line-side electromagnetic interference filter stage, configured to suppress common-mode noise, in combination with the load device injecting noise with a fundamental frequency onto an electric supply line, wherein the load-side passive electromagnetic interference filter stage exhibits a resonance frequency that is smaller or greater than the fundamental frequency of the noise.

2. The electromagnetic interference filter of claim 1, wherein the resonance frequency of the load-side passive electromagnetic interference filter stage is at least two times, preferably five times, smaller or greater than the fundamental frequency of the noise.

3. The electromagnetic interference filter of claim 1, wherein the load-side passive electromagnetic interference stage comprises a first inductive filtering element and a second inductive filtering element each being inductively coupled to the electric supply line and each of the inductive filtering elements being configured to suppress common-mode noise, and a capacitive filtering element, electrically connected to the electric supply line and configured to suppress common-mode and differential-mode noise.

4. The electromagnetic interference filter of claim 1, wherein the intermediate active electromagnetic interference filter stage includes a common-mode current sensor generating a common-mode signal in relation to a common-mode noise circulating in the electric supply line and a current amplifier receiving the common-mode noise signal and whereas the current amplifier is configured to inject a noise cancellation current into the electric supply line.

5. The electromagnetic interference filter of claim 1, wherein the line-side active electromagnetic interference filter stage comprises a voltage amplifier circuit connected to the electric supply line and configured to receive a noise voltage and provide a noise cancellation voltage to the supply line through an actuation transformer inductively coupled to the electric supply line.

6. The electromagnetic interference filter of claim 5, wherein the noise cancellation voltage comprises differential-mode and/or common-mode components.

7. The electromagnetic interference filter of claim 5, wherein the actuation transformer comprises:

a first and a second magnetic core element, and a plurality of separate coil elements each being wound around at least one of the magnetic core elements, wherein the magnetic core elements are arranged to enclose a plurality of conductors of the electric supply line to form a closed magnetic circuit.

8. The electromagnetic interference filter of claim 7, wherein the electric supply line is a single-phase or three-phase or multiphase AC line, and the actuation transformer is configured as a single-phase, respectively a three-phase, respectively multiphase transformer with a single magnetic core formed by the first and second magnetic core elements.

9. Method for manufacturing the electromagnetic interference filter of claim 7, the method comprising the steps of:

providing the first and the second magnetic core element uniting the first and the second magnetic core element for providing a closed magnetic circuit securing the first and the second magnetic core elements connecting the separate coil elements to the load-side terminals on a first side of the actuation transformer and to the line-side terminals on a second side of the actuation transformer opposed the first side.

10. The electromagnetic interference filter of claim 1, wherein the intermediate active electromagnetic interference filter stage and/or the line-side active electromagnetic interference filter stage include an amplifier circuit with a first control loop and a second control loop, wherein the first control loop comprises an amplifier module with a transfer function and a gain function for adjusting a gain of the amplifier module, wherein the second control loop comprises a gain control function configured to adjust the gain function of the first control loop in order to avoid saturation in the amplifier circuit, depending on an input signal.

11. The electromagnetic interference filter of claim 10, wherein the gain control function of the second control loop adjusts the gain function of the first control loop following a linear function with an upper end.

12. The electromagnetic interference filter of claim 11, wherein the upper end of the linear function corresponds to a peak threshold value setpoint in the gain control function.

13. The electromagnetic interference filter of claim 10, wherein the first control loop and the second control loop each is configured to have a time constant, wherein the time constant of the second control loop is greater than the time constant of the first control loop.

* * * * *